United States Patent
Havens

(10) Patent No.: US 7,053,617 B2
(45) Date of Patent: May 30, 2006

(54) INTEGRATED ELECTRONIC RF SHIELDING APPARATUS FOR AN MRI MAGNET

(75) Inventor: Timothy John Havens, Florence, SC (US)

(73) Assignee: General Electric Co., Schnectady, NY (US)

( * ) Notice: Subject to any disclaimer, the term of this patent is extended or adjusted under 35 U.S.C. 154(b) by 0 days.

(21) Appl. No.: 10/605,475

(22) Filed: Oct. 1, 2003

(65) Prior Publication Data
US 2005/0073308 A1 Apr. 7, 2005

(51) Int. Cl.
*G01V 3/00* (2006.01)

(52) U.S. Cl. .................................................. 324/318

(58) Field of Classification Search ............... 324/307, 324/309, 314, 318, 322
See application file for complete search history.

(56) References Cited

U.S. PATENT DOCUMENTS

| | | | |
|---|---|---|---|
| 5,280,248 A * | 1/1994 | Zou et al. .................. 324/318 |
| 5,543,711 A * | 8/1996 | Srinivasan et al. ......... 324/318 |
| 5,550,472 A * | 8/1996 | Richard et al. ............. 324/320 |
| 5,551,430 A * | 9/1996 | Blakeley et al. ............ 600/410 |
| 5,664,568 A * | 9/1997 | Srinivasan et al. ......... 600/422 |
| 5,821,748 A * | 10/1998 | Gatehouse .................. 324/318 |
| 5,898,306 A * | 4/1999 | Liu et al. .................... 324/322 |
| 5,951,474 A * | 9/1999 | Matsunaga et al. ......... 600/422 |
| 5,994,903 A * | 11/1999 | Ladebeck .................... 324/319 |
| 6,029,082 A * | 2/2000 | Srinivasan et al. ......... 600/422 |
| 6,150,816 A * | 11/2000 | Srinivasan .................. 324/318 |
| 6,249,121 B1 * | 6/2001 | Boskamp et al. ........... 324/318 |
| 6,362,622 B1 * | 3/2002 | Stauber et al. .............. 324/318 |
| 6,498,947 B1 | 12/2002 | Boskamp et al. |
| 6,522,144 B1 | 2/2003 | Boskamp |
| 6,591,128 B1 * | 7/2003 | Wu et al. .................... 600/422 |
| 6,593,744 B1 * | 7/2003 | Burl et al. .................. 324/322 |

* cited by examiner

*Primary Examiner*—Diego Gutierrez
*Assistant Examiner*—Dixomara Vargas
(74) *Attorney, Agent, or Firm*—Michael Della Penna

(57) ABSTRACT

An integrated electronic system housing and magnet structure (12) for an imaging system (10) includes a housing (40) and a radio frequency shield (46). The housing (40) is coupled to the magnet structure (13) and contains imaging system support electronics (42). The radio frequency shield (46) is coupled to the housing (40) and prevents radio frequency interference of a radio frequency receiver coil (30) from the imaging system support electronics (42).

25 Claims, 2 Drawing Sheets

INTEGRATED ELECTRONIC RF SHIELDING APPARATUS FOR AN MRI MAGNET

BACKGROUND OF INVENTION

The present invention relates generally to magnetic resonance imager (MRI) systems and components. More particularly, the present invention relates to radio frequency shielding of an MRI magnet structure from MRI system supporting electronics for proximate and integrated coupling therebetween.

Current Magnetic Resonance Imager (MRI) systems include a superconducting magnet structure that generates a temporally constant primary magnetic field. The superconducting magnet is used in conjunction with a magnetic gradient coil assembly, which is sequentially pulsed to create a sequence of controlled gradients in the static magnetic field during a MRI data gathering sequence. The controlled sequential gradients are effectuated throughout a patient imaging volume (patient bore), which is coupled to one or more MRI radio frequency (RF) coils or antennae. The RF coils are located between the magnetic gradient coil assembly and the patient bore.

As a part of a typical MRI, RF signals of suitable frequencies are transmitted into the patient bore. Nuclear magnetic resonance (nMR) responsive RF signals are received from the patient via the RF coils. Information encoded within the frequency and phase parameters of the received RF signals, by the use of a RF circuit, is processed to form visual images. These visual images represent various desired properties of the distribution of nMR nuclei within a cross-section or volume of a patient being scanned within the patient bore.

Various system electronics are utilized to support operation of and process data collected from the MRI system. A majority of the electronics is located separate from and in a different room than the MRI magnet structure. The electronics are located in a separate room to prevent the generation of RF broadband noise, which introduces artifacts in the visual images.

When a break or varying contact between electrical connections occurs in the magnetic field of the magnet RF noise is induced in the magnetic field that causes image artifacts. Image artifacts can even be caused by the motion or rubbing of braided wire, which also induces RF noise. Thus, any metal-to-metal contact on or near the magnet structure can have varying contact and be a source of image artifacts. The artifacts are seen as "white pixels" in the acquired images.

By having the electronics in a separate room from the magnet structure, additional floor space is required. Floor space within an examining facility, such as a hospital, is costly and has limited availability. Also, in order to have the electronics separate from the magnet structure, additional tasks are performed by the MRI system manufacturer, which increases costs of the MRI system.

Thus, there exists a need for an improved MRI system that allows the existence of both the MRI magnet structure and supporting electronics to coexist within a single room without the generation of image artifacts, caused by the close proximity of the supporting electronics with the magnet structure.

SUMMARY OF INVENTION

The present invention provides an integrated electronic system housing and magnet structure for an imaging system. The integrated structure includes a housing and a radio frequency shield. The housing is coupled to the magnet structure and contains imaging system support electronics. The radio frequency shield is coupled to the housing and prevents radio frequency interference of a radio frequency (RF) receiver coil from the imaging system support electronics.

The embodiments of the present invention provide several advantages. One such advantage is the provision of an integrated structure that isolates the RF noise, generated from imaging system support electronics, from the imaging system RF receiver antenna. In so doing, the stated embodiments prevent generation of image artifacts and allow the close proximity and installation of the imaging system electronics and the magnet structure within a single room. Thus, the stated embodiment minimizes space usage of an imaging system and costs involved therein. The installation within a single room of the imaging system support electronics and the magnet structure also minimizes installation costs of the imaging system.

Another advantage that is provided by multiple embodiments of the present invention is the provision of a radio frequency shield that prevents radio frequency interference between a magnetic field, of the magnetic structure, and the imaging system support electronics. By minimizing radio frequency interference, electrical connection troubleshooting is minimized, and thus, maintenance costs involved therein is also minimized.

The present invention itself, together with attendant advantages, will be best understood by reference to the following detailed description, taken in conjunction with the accompanying figures.

BRIEF DESCRIPTION OF DRAWINGS

For a more complete understanding of this invention reference should now be had to the embodiments illustrated in greater detail in the accompanying figures and described below by way of examples of the invention wherein:

FIG. 2 is a block diagrammatic view of the magnetic resonance imaging system of FIG. 1 in accordance with an embodiment of the present invention; and.

DETAILED DESCRIPTION

While the present invention is described with respect to an apparatus for radio frequency shielding an magnetic resonance imaging (MRI) magnet structure from MRI system supporting electronics for proximate and integrated coupling therebetween, the following apparatus is capable of being adapted for various purposes and is not limited to the following applications: MRI systems, computed tomography systems, x-ray imaging systems, radiotherapy systems, and other applications requiring the isolation of system electronics from magnetic or magnetic field generating structures known in the art.

In the following description, various operating parameters and components are described for one constructed embodiment. These specific parameters and components are included as examples and are not meant to be limiting.

Figure 1:
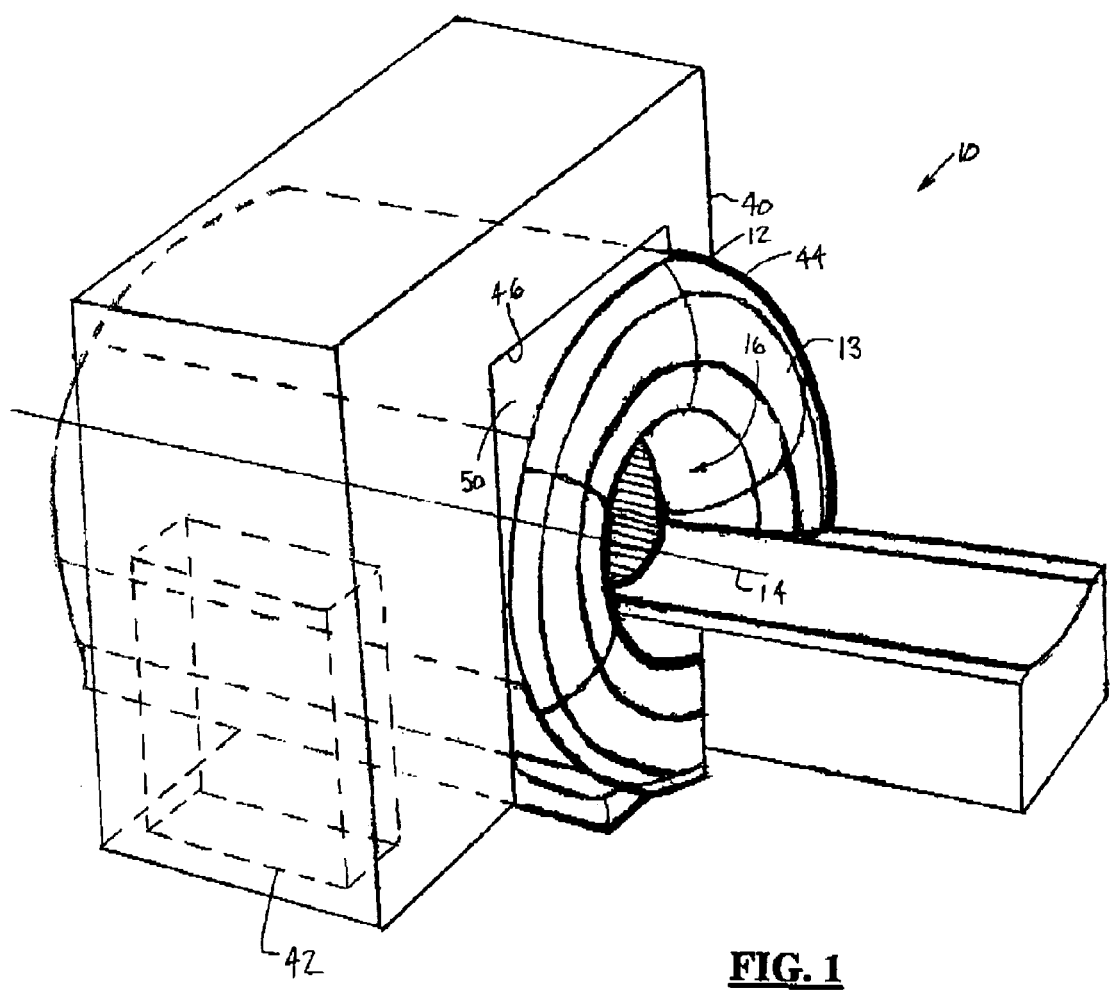
FIG. 1 is a perspective view of a magnetic resonance imaging system incorporating an integrated electronic system housing and magnet structure in accordance with an embodiment of the present invention.
Figure 2:
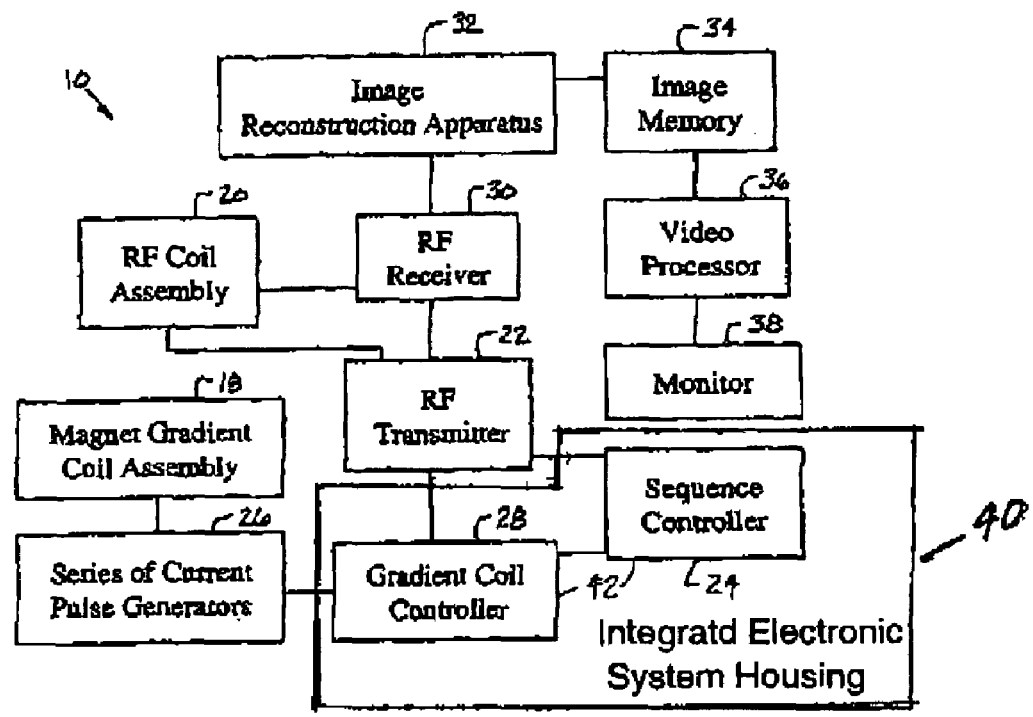

Referring now to FIGS. 1 and 2, a perspective view of a MRI system 10 incorporating an integrated electronic system housing and magnet structure 12 and a block diagrammatic view of the MRI system 10, are shown, in accordance with an embodiment of the present invention. The MRI system 10 includes a static magnet structure 13 (a cylindrical structure) that has a superconducting magnet (not shown). The superconducting magnet generates a temporally constant magnetic field along a longitudinal axis (z-axis) 14 of a central bore (patient bore) 16.

The superconducting magnet is used in conjunction with a magnetic gradient coil assembly 18. The magnetic gradient coil assembly 18 is sequentially pulsed to create a sequence of controlled gradients in the static magnetic field during a MRI data gathering sequence. The controlled sequential gradients are effectuated throughout the central bore 16. The central bore 16 has a radio frequency (RF) coil assembly (antennae) 20 mounted thereon. The RF coil assembly generates RF signals of suitable frequencies that are transmitted into the central bore 16. Nuclear magnetic resonance (nMR) responsive RF signals are received from the central bore 16 via the RF coil assembly 20.

A RF transmitter 22 is coupled to the RF coil assembly 20 and to a sequence controller 24. The RF transmitter 22 may be an analog or a digital device. The sequence controller 24 controls a series of current pulse generators 26 via a gradient coil controller 28. The gradient coil controller 28 is coupled to the magnetic gradient coil assembly 18. The RF transmitter 22 in conjunction with the sequence controller 24 pulses the RF signals for excitation and manipulation of the magnetic resonance in selected dipoles of a portion of the subject within the central bore 16.

A RF receiver antenna or coil 30 is coupled to the RF coil assembly 20 for demodulating magnetic resonance signals emanating from an examined portion of the subject. An image reconstruction apparatus 32 reconstructs the received magnetic resonance signals into an electronic image representation that is stored in an image memory 34. A video processor 36 converts the stored electronic images into an appropriate format for display on a video monitor 38.

The integrated structure 12 includes an integrated electronic system housing or first housing 40 and a second housing 44. The first housing 40 contains imaging system supporting electronics 42. The second housing 44 contains the magnet structure 13. The first housing 40 and the second housing 44 may be separate housings, as shown, or may be formed together as a single integrated housing and configured to couple the magnet structure 13. The first housing 40 and the second housing 44 may be of various sizes, shapes, styles, and may have various compartments contained therein. For example, a magnet side 46 of the first housing 40 may be shaped as to correspond with contours of an exterior side 50 of the second housing 44. The first housing 40 and the second housing 44 may be formed of various materials, some of which are stated below.

Figure 3:
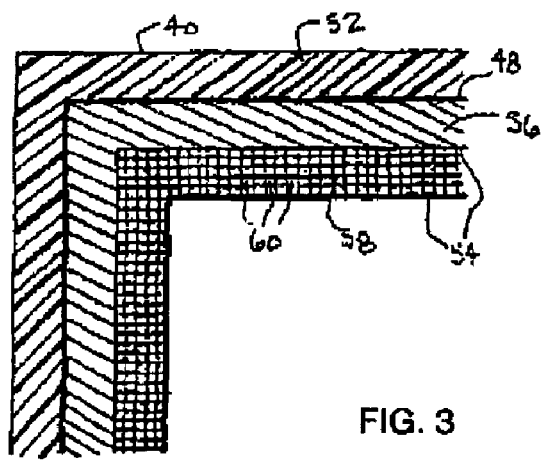
FIG. 3 is a cross-sectional corner view of an integrated electronic system housing for a magnet structure in accordance with an embodiment of the present invention.

The first housing 40 includes a RF shield 48, as is best seen in FIG. 3. The RF shield 48 is coupled within the first housing 40 and fully encases the supporting electronics 42. By fully encasing the supporting electronics 42, the RF shield 48 isolates the support electronics 42 from the RF receiver coil 30. Isolation of the support electronics 42 allows the close proximity of the electronics 42 with the magnet structure 13. The RF shield 48 may be in the form of a superconductor.

The supporting electronics 42 may include any electronics utilized in the operation of the magnet structure 13 and in the generation of the electronic images. The supporting electronics 42 may include radio frequency amplifiers, gradient amplifiers, timing devices, oscillators, radio frequency transmitters, and other support electronics known in the art. The support electronics 42 may include various controllers, such as the gradient coil controller 28 and the sequence controller 24.

Referring now to FIG. 3, a cross-sectional corner view of the first housing 40 in accordance with an embodiment of the present invention is shown. The electronic system housing 40 includes the RF shield 48, which is coupled within and directly to an outer shell 52. The outer shell 52 may be formed of various materials, such as plastic, metal, or other desirable material known in the art. Although the first housing 40 is described as having an outer shell and an RF shield, the first housing 40 may simply have an outer shell that has properties of and performs as an RF shield.

In the embodiment of FIG. 3, the RF shield 48 is shown as having a pair of conductive layers 54. The pair of conductive layers 54 includes a first layer 56 and a second layer 58. The first layer 56 is shown as a thin solid metallic layer and the second layer 58 is shown as a conductive mesh. The RF shield 48 may include any number of layers and each layer may be of similar or varying form.

The conductive layers 54 may be formed of copper, aluminum, or some other material having similar properties. Capacitance may exist between the layers 54, such that the layers 54 perform as a solid shield. The layers 54 may have openings or voids, such as voids 60 in the layer 58, which render the shield 48 more transparent to gradient magnetic fields. The layers 54 may be sized and have thickness to reflect RF frequencies and be transparent to gradient fields.

The RF shield 48 may be coupled to the outer shell 52 using various techniques known in the art. The RF shield 48 may be bonded, adhered, fastened, or molded to the outer shell 52. The RF shield 48 may be located in various locations on or within the outer shell 52. The RF shield 48 may be external to, be an integral part of, or be contained within the outer shell 52, or may be in some combination thereof.

The RF shield 48 isolates the support electronics 42 from the RF receiver coil 30. The isolation of the supporting electronics 42 from the RF receiver coil 30 decreases maintenance costs of the supporting electronics 42. With the supporting electronics 42 isolated from the RF receiver coil 30, any potential affect of varying electrical contacts from or contained within the supporting electronics 42 is reduced and/or eliminated. Thus, the RF shield 48 minimizes the need for troubleshooting the electronics 42.

The present invention provides an integrated electronic system and magnet structure apparatus that allows for the close proximity of imaging system support electronics with an imaging system magnet structure. In so doing, the present invention allows for the inclusion and coexistence of the support electronics and the magnet structure in a single room, which decreases installation and maintenance costs, as well as, building costs for housing the imaging system.

The above-described apparatus and method, to one skilled in the art, is capable of being adapted for various applications and systems known in the art such as noncylindrical open systems. The above-described invention can also be varied without deviating from the true scope of the invention.

The invention claimed is:

1. An integrated electronic system housing and magnet structure for an imaging system comprising:
   a magnet structure containing;
      a superconducting magnet; and an RF coil assembly;

a housing attached to and external from said magnet structure, said housing containing imaging system support electronics having a controller and not said RF coil assembly; and a radio frequency shield coupled to said housing and preventing radio frequency interference between said imaging system support electronics and said RF coil assembly.

2. An integrated electronic system housing and magnet structure as in claim 1 wherein said radio frequency shield is coupled within said housing.

3. An integrated electronic system housing and magnet structure as in claim 1 wherein said imaging system support electronics is encased in said radio frequency shield.

4. An integrated electronic system housing and magnet structure as in claim 1 wherein said radio frequency shield is coupled within said housing and encases said imaging system support electronics.

5. An integrated electronic system housing and magnet structure as in claim 1 wherein said imaging system support electronics comprises at least one of a radio frequency amplifier, a gradient amplifier, a timing device, an oscillator, a radio frequency transmitter, a gradient coil controller, and a sequence controller.

6. An integrated electronic system housing and magnet structure as in claim 1 wherein said radio frequency shield comprises at least one layer.

7. An integrated electronic system housing and magnet structure as in claim 6 wherein said at least one layer comprises:

a first layer; and a second layer coupled to said first layer;

said first layer and said second layer having capacitance therebetween.

8. An integrated electronic system housing and magnet structure as in claim 1 wherein said radio frequency shield is metallic.

9. An integrated electronic system housing and magnet structure as in claim 1 wherein said radio frequency shield is a conductive mesh.

10. An integrated electronic system housing and magnet structure as in claim 1 wherein said radio frequency shield is a superconductor.

11. An integrated electronic system housing and magnet structure as in claim 1 wherein said radio frequency shield comprises at least one void.

12. An integrated electronic system housing and magnet structure as in claim 1 wherein said radio frequency shield reflects radio frequencies.

13. An integrated electronic system housing and magnet structure as in claim 1 wherein said housing does not contain said magnet structure.

14. An integrated electronic system housing and magnet structure as in claim 1 wherein said magnet structure and said imaging system support electronics reside within the same room.

15. An imaging system comprising:

a magnet structure generating at least one magnetic field and containing;

a superconducting magnet;

a gradient coil assembly; and an RF coil assembly;

a first housing external, separate and coupled to said magnet structure and containing imaging system support electronics having a microprocessor and not said RF coil assembly; and a radio frequency shield coupled to said housing and preventing radio frequency interference between said at least one magnetic field arid said imaging system support electronics.

16. An imaging system as in claim 15 further comprising a second housing containing said magnet structure, wherein said first housing and said second housing are integrally formed as a single unit.

17. A system as in claim 15 wherein said imaging system support electronics is encased in said radio frequency shield.

18. A system as in claim 15 wherein said radio frequency shield is coupled within said housing and encases said imaging system support electronics.

19. A system as in claim 15 wherein said radio frequency shield comprises at least one layer.

20. A system as in claim 19 wherein said at least one layer comprises:

a first layer; and a second layer coupled to said first layer;

said first layer and said second layer having capacitance therebetween.

21. A system as in claim 15 wherein said radio frequency shield is metallic.

22. A system as in claim 15 wherein said radio frequency shield is a conductive mesh.

23. A system as in claim 15 wherein said radio frequency shield is a superconductor.

24. A system as in claim 15 further comprising a second housing that is separate, attached, and external from said first housing and contains said magnet structure.

25. An imaging system comprising:

a first housing having imaging system support electronics comprising at least one of a radio frequency amplifier, a gradient amplifier, a timing device, an oscillator, a radio frequency transmitter, a gradient coil controller, and a sequence controller;

a second housing integrally formed with said first housing and containing a magnet structure that is separate from said first housing, generates at least one magnetic field, and contains;

a superconducting magnet;

a gradient coil assembly; and at least one radio frequency receiver coil; and a radio frequency shield coupled within said first housing, encasing said imaging system support electronics, and preventing radio frequency interference between said imaging system support electronics and said at least one radio frequency receiver coil.

* * * * *